United States Patent
Heurtier et al.

(10) Patent No.: US 7,170,768 B2
(45) Date of Patent: Jan. 30, 2007

(54) INTEGRATED RECTIFYING ELEMENT

(75) Inventors: Jérôme Heurtier, Tours (FR); Arnaud Florence, Saint Cyr sur Loire (FR); Franck Galtié, Veretz (FR)

(73) Assignee: STMicroelectronics S.A., Montrouge (FR)

( * ) Notice: Subject to any disclaimer, the term of this patent is extended or adjusted under 35 U.S.C. 154(b) by 238 days.

(21) Appl. No.: 10/726,451

(22) Filed: Dec. 3, 2003

(65) Prior Publication Data

US 2004/0109336 A1 Jun. 10, 2004

(30) Foreign Application Priority Data

Dec. 4, 2002 (FR) .................................. 02 15320

(51) Int. Cl.
*H02M 7/217* (2006.01)
(52) U.S. Cl. ..................................... 363/217
(58) Field of Classification Search ............ 363/44, 363/52, 125, 127
See application file for complete search history.

(56) References Cited

U.S. PATENT DOCUMENTS

| 6,256,214 | B1 * | 7/2001 | Farrington et al. | 363/127 |
| 6,438,009 | B2 * | 8/2002 | Assow | 363/127 |
| 6,459,600 | B2 * | 10/2002 | Farrington et al. | 363/89 |
| 6,597,592 | B2 * | 7/2003 | Carsten | 363/127 |

FOREIGN PATENT DOCUMENTS

DE   31 24 891 A1   1/1983

* cited by examiner

*Primary Examiner*—Adolf Bernane
(74) *Attorney, Agent, or Firm*—Lisa K. Jorgenson; David V. Carlson; Seed IP Law Group PLLC

(57) ABSTRACT

A controllable rectifying element, comprising a bipolar transistor having a current input terminal connected to a control terminal by a first switch and having a current output terminal connected to the control terminal by a second switch, the turn-off and turn-on phases of the first and second switches being complementary and depending on the state desired for the rectifying element.

20 Claims, 1 Drawing Sheet

INTEGRATED RECTIFYING ELEMENT

BACKGROUND OF THE INVENTION

1. Field of the Invention

The present invention relates to the forming in integrated form of a rectifying element or rectifier.

2. Discussion of the Related Art

In the present description, an element performing a function identical to that of a bipolar diode, for example, used in D.C./D.C. converters of voltage step-down or step-up type, is designated as a rectifier.

FIG. 1 shows a conventional example of a D.C./D.C. voltage step-up converter 1 (CONV) supplying a load 2 (Q). Converter 1 provides a D.C. voltage Vout between terminals S and M of a storage capacitor 3 from a D.C. supply voltage Vin of lower level, applied between two input terminals E and M, terminal M forming, for example, a common ground with load 2. Load 2 is connected between terminals S and M of capacitor 3. For example, load 2 is formed of two light-emitting diodes of a backlighted screen.

Converter 1 comprises, in series between terminals E and S, an inductance 4 and a rectifying element 5 (RECTIF). Rectifier 5 is oriented to enable flowing of a current from inductance 4 to capacitor 3. A controllable switch 6 is connected between input terminal 7 of rectifier 5 and reference rail M. Generally, switch 6 is a MOS transistor having its control terminal formed by its gate receiving a pulse-width modulated signal PWM intended to regulate voltage Vout from either a reference voltage, or the load needs. The PWM signal, depending on the application, is provided by a control circuit not shown.

The rectifier is intended to act as a diode, that is, to block the reverse current when voltage Vout across the load becomes greater than the voltage across switch 6.

In the simplest applications, rectifier 5 is formed of a simple diode, generally of a Schottky diode. Such a Schottky diode has the disadvantage of being uneasily integrable.

Further, in many applications and especially in the case of a switched-mode application such as illustrated in FIG. 1, it is desired to be able to turn off the load supply circuit, either due to the presence of an electric problem therein (for example, a short-circuit), or for other reasons. Such a function of a rectifier element is generally designated as a true shutdown. Such a function especially enables, if switch 6 is off, preventing supply voltage Vin present between terminals E and M from recharging capacitor 3 while this is not desired. This especially enables performing a protection function by preventing overcurrents in case of a short-circuit on the load side (between terminals S and M).

To perform this function, a rectifier 5 formed of a diode D in series with a switch 8 is thus generally used, as illustrated in FIG. 1. Switch 8 is controlled by a circuit 9 (CTRL) receiving an enable signal EN from a control organ of the converter. Enable signal EN is used, for example, to interrupt the converter operation by the turning-off of switch 8 in case of a short-circuit in the load (detected by means not shown), in case of a problem on the side of the switched-mode power supply (PWM) control circuit, or more generally as soon as a turning-off of the converter is desired to be guaranteed. In practice, switch 8 is generally formed of a MOS transistor.

A disadvantage of rectifier 5 of FIG. 1 is the addition, in normal operation, of a voltage drop due to the on-state series resistance of switch 8 (Ron of the MOS transistor).

Another disadvantage is linked to the bulk of the high-voltage MOS transistor forming switch 8.

It has also been provided to form the rectifier in the form of a single MOS transistor by using its parasitic bulk-source diode. Such a solution requires being able to control the bulk connection to ground to control the parasitic diode. When a circuit shutdown is desired, the polarities of the MOS transistor and of its bulk are reversed to reverse the polarity of its parasitic diode. Another disadvantage is that the actual transistor must be controlled at the frequency of the PWM signal. In normal operation, the transistor is controlled in reverse fashion with respect to switch 6.

In addition to the difficulty linked to the need for controlling the transistor at the frequency of the PWM signal, the source of the transistor is floating, which poses problems of control reference of its gate signal. This generally results in using level-shifting circuits, which makes the circuit particularly complex, especially for a high-voltage operation.

The series association of diode D with switch 8 could have been devised to be replaced by a thyristor. However, such a solution is incompatible with switched-mode power supplies. Indeed, a thyristor would require being controlled to be turned off each time switch 6 is off. Now, the frequencies of the trains of width-modulated pulses are generally of several tens, or even hundreds of kilohertz, which is incompatible with switching rates currently available for thyristors.

SUMMARY OF THE INVENTION

The present invention aims at providing a novel controllable rectifier which has advantages over known solutions.

The present invention especially aims at providing a controllable resistor capable of isolating, at its turning-on, the elements that it separates.

The present invention also aims at providing a rectifier in which the series voltage drop in normal operation is minimized.

The present invention also aims at providing a solution compatible with an integration and which is of minimum bulk.

To achieve these and other objects, the present invention provides a controllable rectifying element, comprising a bipolar transistor having a current input terminal connected to a control terminal by a first switch and having a current output terminal connected to the control terminal by a second switch, the turn-off and turn-on phases of the first and second switches being complementary and depending on the state desired for the rectifying element.

According to an embodiment of the present invention, the rectifying element further comprises a circuit for controlling the first and second switches according to the state of a signal for enabling/disabling the rectifying element.

According to an embodiment of the present invention, said switches are formed of P-channel MOS transistors having their respective gates connected to the control terminal of the bipolar transistor via current sources.

According to an embodiment of the present invention, the control circuit comprises two N-channel MOS transistors connecting the respective gates of the P-channel MOS transistors to ground, said N-channel MOS transistors being respectively controlled by the enable signal and by its inverse.

According to an embodiment of the present invention, said bipolar transistor is a PNP transistor.

According to an embodiment of the present invention, said bipolar transistor is an NPN transistor.

The present invention also provides a voltage converter of D.C./D.C. type comprising a rectifying element.

The foregoing objects, features, and advantages of the present invention will be discussed in detail in the following non-limiting description of specific embodiments in connection with the accompanying drawings.

DETAILED DESCRIPTION

Figure 1:
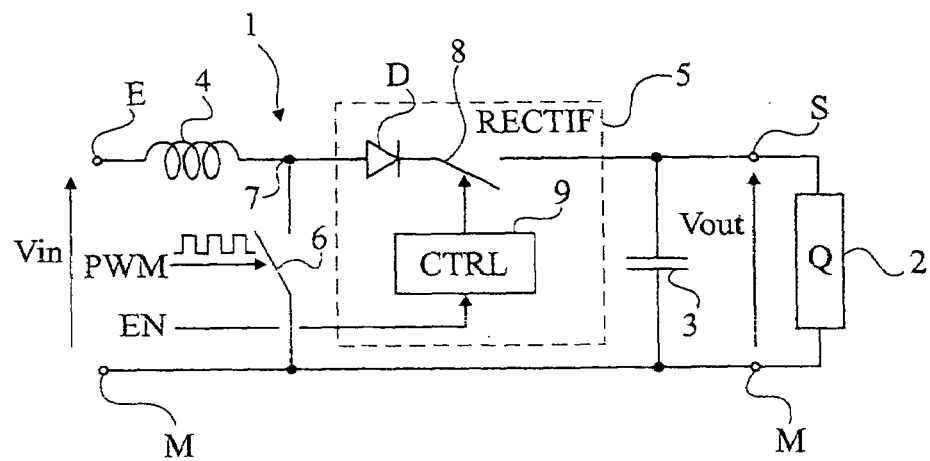
FIG. 1, previously described, schematically and partially illustrates a D.C./D.C. converter of voltage step-up type comprising a known rectifying element.

Same elements have been designated with same reference numerals in the different drawings. For clarity, only those elements that are necessary to the understanding of the present invention have been shown in the drawings and will be described hereafter. In particular, the generation of the different control signals has not been shown and is no object of the present invention. The present invention applies whatever the reason for which the rectifying element is desired to be made controllable. The generation of the enable/disable signal, be it based on a detection of a short-circuit in the load or of another malfunction, remains conventional.

Further, the present invention will be described hereafter in relation with an example of application to a D.C./D.C. converter of switched mode power supply type. It should however be noted that it more generally applies to the forming of a controllable rectifying element whatever the application.

Figure 2:
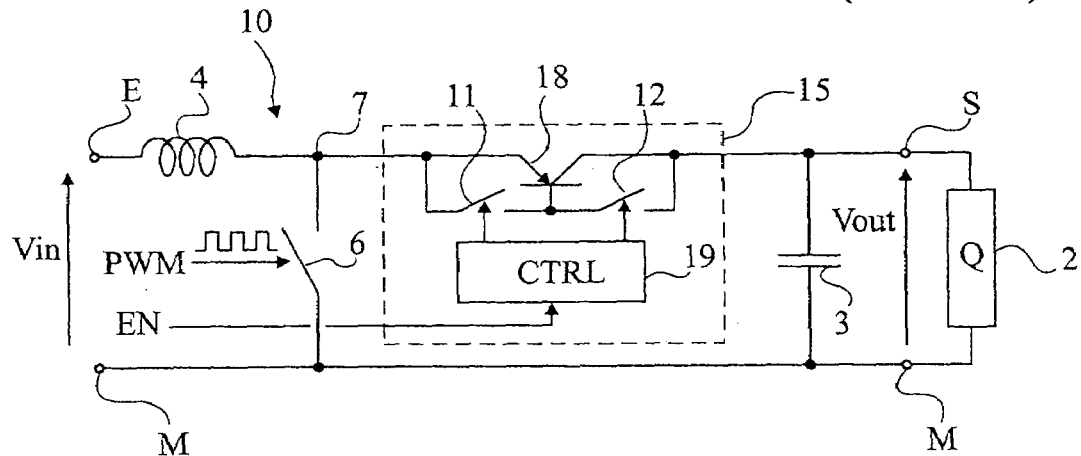
FIG. 2 partially and schematically shows an embodiment of a voltage step-up converter comprising a controllable rectifying element according to the present invention.

FIG. 2 very schematically shows in a view to be compared with that of previously-described FIG. 1 an embodiment of a D.C./D.C. converter 10 of switched-mode power supply type using a rectifier 15 specific to the present invention. As previously, the converter comprises two input terminals E and M between which is applied a voltage Vin and two output terminals S and M (terminal M forming for example a common ground terminal) for providing a voltage Vout to a load 2 (Q). Converter 10 comprises, in series between terminals E and S, an inductance 4 and rectifying element 15, and between terminals S and M, a storage capacitor 3. A switch 6 controlled by a pulse-width modulation signal (PWM) of high frequency (generally several tens of kilohertz) connects an input terminal 7 of rectifying element 15 to ground M.

Converter 10 of FIG. 2 differs from that of FIG. 1 only by the structure of its rectifier 15.

According to this embodiment of the present invention, rectifier 15 is formed of a PNP-type bipolar transistor 18 having its emitter forming input terminal 7 of rectifier 15 and having its collector forming the output terminal connected to terminal S.

According to the present invention, the base of transistor 18 is connected to its emitter by a switch 11 and to its collector by a switch 12. Switches 11 and 12 are controlled by a circuit 19 (CTRL) receiving an enable signal EN of the rectifier. Signal EN originates, like for a conventional controllable rectifier, from an anomaly detection circuit (short-circuit or other) of the control circuit of switch 6 of the switched-mode power supply, etc.

The function of control circuit 19 is to control switches 11 and 12 by making sure, among others, that they are not simultaneously on.

In normal operation, switch 12 is on while switch 11 is off. Transistor 18 is thus diode-connected, which implies that it operates at the limit of the linear state. Thus, the voltage drop thereacross is minimum and is equivalent to that of a forward-biased bipolar diode (forward-biased base-emitter junction). In normal operation, switches 11 and 12 remain in this state (no switching) and the converter operates by control of switch 6.

When enable signal EN is switched to a low state indicative of a disabling of the circuit, control circuit 19 turns on switch 11 and turns off switch 12. Transistor 18 is then equivalent to its base-collector junction which, it being a PNP transistor, is effectively reverse-biased if input voltage Vin is greater than voltage Vout across capacitor 3.

An advantage which already appears from the description of FIG. 2 is that the voltage drop of controllable rectifying element 15 in the on state is smaller than that of conventional circuit 5. According to the present invention, the voltage drop of an on-state diode is reproduced.

Another advantage is that switches 11 and 12, although having to stand a high voltage between their terminals, only see the flowing of a very small current in the on state. Indeed, whatever the operating mode and due to the fact that transistor 18 is not saturated, the current likely to run through switch 11 and 12 is, with respect to the current flowing between the emitter and collector of transistor 18, divided by the gain ($\beta$) of the transistor.

In practice, this results in permitting the surface area of each switch 11 and 12 to be small, in an integrated implementation, to approximately correspond to the surface area required to form transistor 18, divided by the gain thereof.

Figure 3:
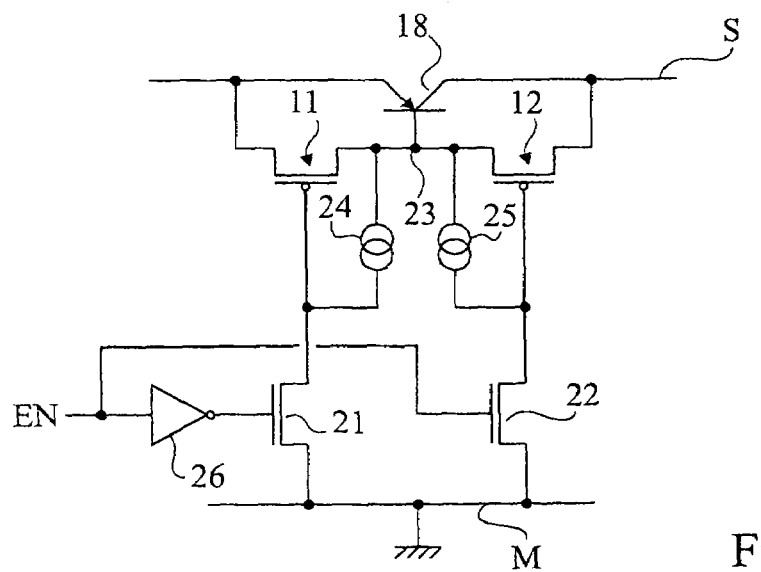
FIG. 3 partially and schematically shows a detailed embodiment of the rectifying element of FIG. 2.

FIG. 3 shows an embodiment of a control circuit 19 for controlling switches 11 and 12 of a rectifier 15 according to the present invention. In this example, switches 11 and 12 are formed of P-channel MOS transistors. The respective gates of each transistor are connected to ground M by an N-channel MOS transistor, respectively, 21, 22, and base 23 of transistor 18 is connected to the gates of transistors 11 and 12 by current sources, respectively, 24, 25. The respective gates of transistors 21 and 22 receive enable signal EN, via an inverter 26 for one of the transistors (for example, transistor 21). It is here assumed that signal EN is active in the high state.

In normal operation, signal EN is thus high and imposes the turning-on of transistor 22 and the turning-off of transistor 21. Since transistor 22 is on, the gate of transistor 12 is pulled to ground, which turns it off and short-circuits terminals 23 and S. As for transistor 11, it remains off, its gate being in the air.

Upon switching of signal EN to the low state, transistor 21 turns on while transistor 22 turns off. In the absence of current source 25, the turning-off of the transistor would make the gate of transistor 12 floating. Current source 25 thus enables carrying the charges away therefrom to guarantee its turning-off. Similarly, current source 24 is used to evacuate the charges from MOS transistor 11 upon turning-off of transistor 21 when signal EN switches high. Current sources 25 and 24 are formed, in the simplest fashion, of a resistor or, as an alternative, of any element performing this function, for example, MOS transistors adequately controlled by signal EN.

The embodiment of FIG. 3 uses P-channel MOS transistors for switches 11 and 12, which is preferable since this avoids use of a level shifter to control an N-channel MOS transistor.

An advantage of the present invention is that the integration surface necessary to form rectifier 15 is considerably reduced as compared to the conventionally formed rectifier. In particular, in a technology where MOS transistors are formed vertically, P-channel MOS transistors 11 and 12, which must stand the high voltage but only need letting through a small current, take up a small surface area (proportional to the current that they must stand).

Another advantage is that the rectifying element is easily integrable, if need be with its control circuit.

Another advantage, induced by the circuit of the present invention and the use of a bipolar transistor, is that the current flowing through the rectifying element is automatically limited. Indeed, the base current of bipolar transistor 18 is a function of the current between its emitter and its collector, and thus of the current in inductance 4. Accordingly, a variation of the current in inductance 4 translates as a variation in the operating point of transistor 18.

Of course, the present invention is likely to have various alterations, modifications, and improvement which will readily occur to those skilled in the art. In particular, it has been assumed hereabove that transistor 18 is a PNP-type transistor. It may however be an NPN-type transistor. The modification of the connections to enable use of an NPN-type transistor is within the abilities of those skilled in the art based on the above functional description. In particular, switches 11 and 12 are then adapted to enable injection of a base current in normal operation.

Further, although the present invention has been described in relation with an application to a voltage step-up converter, it also applies to voltage step-down converters and, more generally, as soon as a controllable rectifying element is desired to be used.

Such alterations, modifications, and improvements are intended to be part of this disclosure, and are intended to be within the spirit and the scope of the present invention. Accordingly, the foregoing description is by way of example only and is not intended to be limiting. The present invention is limited only as defined in the following claims and the equivalents thereto.

What is claimed is:

1. A controllable rectifying element, comprising a bipolar transistor having a current input terminal connected to a control terminal by a first switch, the current input terminal coupled to a first potential voltage higher than ground potential, and having a current output terminal directly connected to the control terminal by a second switch, the current output terminal coupled to a second potential voltage higher than ground potential, the turn-off and turn-on phases of the first and second switches being complementary and depending on the state desired for the rectifying element.

2. The rectifying element of claim 1, further comprising a circuit for controlling the first and second switches according to the state of a signal for enabling/disabling the rectifying element.

3. The rectifying element of claim 1, wherein said switches are formed of P-channel MOS transistors having their respective gates connected to the control terminal of the bipolar transistor via current sources.

4. The rectifying element of claim 2, wherein said switches are formed of P-channel MOS transistors having their respective gates connected to the control terminal of the bipolar transistor via current sources.

5. The rectifying element of claim 4, wherein the control circuit comprises two N-channel MOS transistors connecting the respective gates of the P-channel MOS transistors to ground, said N-channel MOS transistors being respectively controlled by the enable signal and by its inverse.

6. The rectifying element of claim 1, wherein said bipolar transistor is a PNP transistor.

7. The rectifying element of claim 1, wherein said bipolar transistor is an NPN transistor.

8. A voltage converter of D.C./D.C. type comprising the rectifying element of claim 1.

9. A rectifying circuit comprising:
   a supply transistor having an input terminal, an output terminal and a control terminal, the input terminal coupled to a first potential voltage higher than ground potential and the output terminal coupled to a second potential voltage higher than ground potential;
   a first switch for selectively coupling the input terminal of the supply transistor to the control terminal of the supply transistor;
   a second switch for selectively coupling the output terminal of the supply transistor to the control terminal of the supply transistor; and
   a control signal line coupled to the first and second switches that selectively enables one of the switches to connect the respective terminals to the control terminal and disables the other of the switches from connecting their respective terminal to the control terminal.

10. The rectifying circuit according to claim 9 wherein the supply transistor is a bipolar transistor.

11. The rectifying circuit according to claim 9 wherein said first and second switches are composed of MOS transistors.

12. The rectifying circuit according to claim 10 further including an inverter positioned between the control signal line and the first and second switches, respectively, ensuring that the two switches are in opposite states at all times.

13. The rectifying circuit according to claim 12, further including:
   respective MOS transistors coupled to control gates of the first and second MOS transistors acting as the switches, the inverter being coupled to the gate of one of the additional MOS transistors and not to the gate of the other additional MOS transistors.

14. The rectifying circuit according to claim 9, further including first and second current sources extending from the control terminal of the supply transistor to respective gate terminals of the MOS transistors acting as switches.

15. The rectifying circuit according to claim 9, wherein said input control signal line provides an enable signal for switching the rectifier element on.

16. The rectifying circuit according to claim 9, further including an inductor coupled to the input of the supply transistor and a switching element coupled between the inductor and the input terminal to the supply transistor for selectively coupling the input of the supply transistor to the inductor output or to a voltage reference source.

17. The rectifier circuit according to claim 16, wherein said voltage reference source is ground.

18. The rectifying circuit according to claim 11 wherein the rectifier circuit is integrated onto a single silicon substrate and the area in silicon substrate occupied by the MOS transistors is smaller than the area occupied by the supply transistor and the difference in area occupied is approximately proportional to the expected current flowing through the supply transistor divided by the gain of the supply transistor.

19. A rectifying circuit comprising:
a semiconductor substrate;
a power supply transistor formed in the semiconductor substrate, the power supply transistor having an input terminal, an output terminal and a control terminal, the input terminal coupled to a first potential voltage higher than ground potential and the output terminal coupled to a second potential voltage higher than ground potential;
a first switch in the semiconductor substrate, the first switch having one terminal coupled to the input terminal of the power supply transistor and another terminal connected to the control terminal of the power supply transistor, the area of the semiconductor substrate occupied by the first switch being substantially smaller than the area occupied by the power supply transistor;
a second switch in the semiconductor substrate, the second switch having a first terminal coupled to the output terminal of the power supply transistor and a second terminal connected to the control terminal of the power supply transistor, the area of the semiconductor substrate occupied by the second switch being substantially smaller than the area occupied by the power supply transistor; and
a control signal line coupled to the first and second switches to selectively enable one of the switching elements to connect the control terminal to the respective switch's first terminal and disable the other of the switches from connecting the control terminal to the respective switch's first terminal.

20. The rectifying circuit according to claim 19 wherein the difference in the area occupied in the silicon substrate by the power supply transistor and the respective first and second switches is approximately proportional to the expected current flowing through the power supply transistor divided by the gain of the supply transistor.

* * * * *